United States Patent
Xu et al.

(10) Patent No.: US 9,645,280 B2
(45) Date of Patent: May 9, 2017

(54) GLOBAL GRID BUILDING IN REVERSE FAULTED AREAS BY AN OPTIMIZED UNFAULTING METHOD

(71) Applicant: Landmark Graphics Corporation, Houston, TX (US)

(72) Inventors: Zitao Xu, Katy, TX (US); Genbao Shi, Sugar Land, TX (US); Chikang David Chien, Sugar Land, TX (US); Jeffrey Yarus, Houston, TX (US); Richard L. Chambers, Yukon, OK (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 0 days.

(21) Appl. No.: 14/892,470

(22) PCT Filed: Sep. 3, 2013

(86) PCT No.: PCT/US2013/057830
§ 371 (c)(1),
(2) Date: Nov. 19, 2015

(87) PCT Pub. No.: WO2015/034464
PCT Pub. Date: Mar. 12, 2015

(65) Prior Publication Data
US 2016/0116636 A1    Apr. 28, 2016

(51) Int. Cl.
*G06F 17/50*    (2006.01)
*G06F 17/30*    (2006.01)
(Continued)

(52) U.S. Cl.
CPC ...... *G01V 99/005* (2013.01); *G06F 17/30336* (2013.01); *G06F 17/5009* (2013.01); *G06T 17/05* (2013.01)

(58) Field of Classification Search
None
See application file for complete search history.

(56) References Cited

U.S. PATENT DOCUMENTS

| 7,480,205 B2 | 1/2009 | Wei |
| 8,386,180 B2 | 2/2013 | Davies |
| (Continued) | | |

FOREIGN PATENT DOCUMENTS

| EP | 2631685 A2 | 8/2013 |
| WO | WO-2015034464 A1 | 3/2015 |

OTHER PUBLICATIONS

"International Application Serial No. PCT/US2013/057830, International Search Report mailed Jun. 5, 2014", 3 pgs.
(Continued)

*Primary Examiner* — Omar Fernandez Rivas
*Assistant Examiner* — Herng-Der Day

(57) ABSTRACT

A method to generate a global grid may include storing at least one data structure representing a plurality of fault blocks associated with one or more faults in a geographic formation; selecting two fault blocks associated with a fault of the one or more faults; changing the position of a first of the two fault blocks in the at least one data structure representative of a shift of the first fault block towards the other fault block of the two fault blocks to position the center of gravity of a fault boundary of the first fault block with the center of gravity of a fault boundary of the other fault block; aligning the first fault block with the other fault block according to a permitted level of conflict between fault blocks; and updating the at least one data structure to indicate a merging of the two selected fault blocks.

20 Claims, 12 Drawing Sheets

(51) Int. Cl.
*G01V 99/00* (2009.01)
*G06T 17/05* (2011.01)

(56) References Cited

U.S. PATENT DOCUMENTS

| | | | | |
|---|---|---|---|---|
| 8,935,141 | B2 * | 1/2015 | Ran | G06T 17/20 |
| | | | | 345/419 |
| 9,536,022 | B1 * | 1/2017 | Tertois | G06F 17/5009 |
| 2012/0022837 | A1 | 1/2012 | Asbury et al. | |
| 2013/0054201 | A1 | 2/2013 | Posamentier et al. | |

OTHER PUBLICATIONS

"International Application Serial No. PCT/US2013/057830, Written Opinion mailed Jun. 5, 2014", 4 pgs.

\* cited by examiner

GLOBAL GRID BUILDING IN REVERSE FAULTED AREAS BY AN OPTIMIZED UNFAULTING METHOD

PRIORITY APPLICATION

This application is a U.S. National Stage Filing under 35 U.S.C. §371 from International Application No. PCT/US2013/057830, filed Sep. 3, 2013, which application is incorporated herein by reference in its entirety.

TECHNICAL FIELD

This patent document pertains generally to an unfaulting method, and more particularly, but not by way of limitation, to global grid building in reverse faulted areas by an optimized unfaulting method.

BACKGROUND

Geological faults occur when there has been a fracture along which the blocks of the earth's crust (e.g., fault blocks) on either side have moved relative to one another parallel to the fracture (e.g., the fault plane). By definition, the fault block that is above the fault plane is considered the hanging wall and the fault block that is below the fault plane is defined as the footwall. Different types of faults are classified based on the orientation of the fault blocks. For example, a "normal fault" occurs when the hanging wall moves down relative to the footwall and may occur when there is an expansion of the crust. Alternatively, a "reverse fault" occurs when the hanging wall moves up relative to the footwall and occurs when the crust is compressed. A model may be generated that represents a reverse fault, however, the model may have duplicate cell coordinates along a reverse fault.

BRIEF DESCRIPTION OF DRAWINGS

Some embodiments are illustrated by way of example and not limitation in the figures of the accompanying drawings in which.

DETAILED DESCRIPTION

The following detailed description of the present subject matter refers to subject matter in the accompanying drawings which show, by way of illustration, specific aspects and embodiments (also referred to as examples) in which the present subject matter may be practiced. These embodiments are described in sufficient detail to enable those skilled in the art to practice the present subject matter. References to "an," "one," or "various" embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

Geological faults occur when there has been a fracture along which the blocks of the earth's crust (e.g., fault blocks) on either side have moved relative to one another parallel to the fracture (e.g., the fault plane). By definition, the fault block that is above the fault plane is considered the hanging wall and the fault block that is below the fault plane is defined as the footwall. Different types of faults are classified based on the orientation of the fault blocks. For example, a "normal fault" occurs when the hanging wall moves down relative to the footwall and may occur when there is an expansion of the crust. Alternatively, a "reverse fault" occurs when the hanging wall moves up relative to the footwall and occurs when the crust is compressed.

Figure 1:
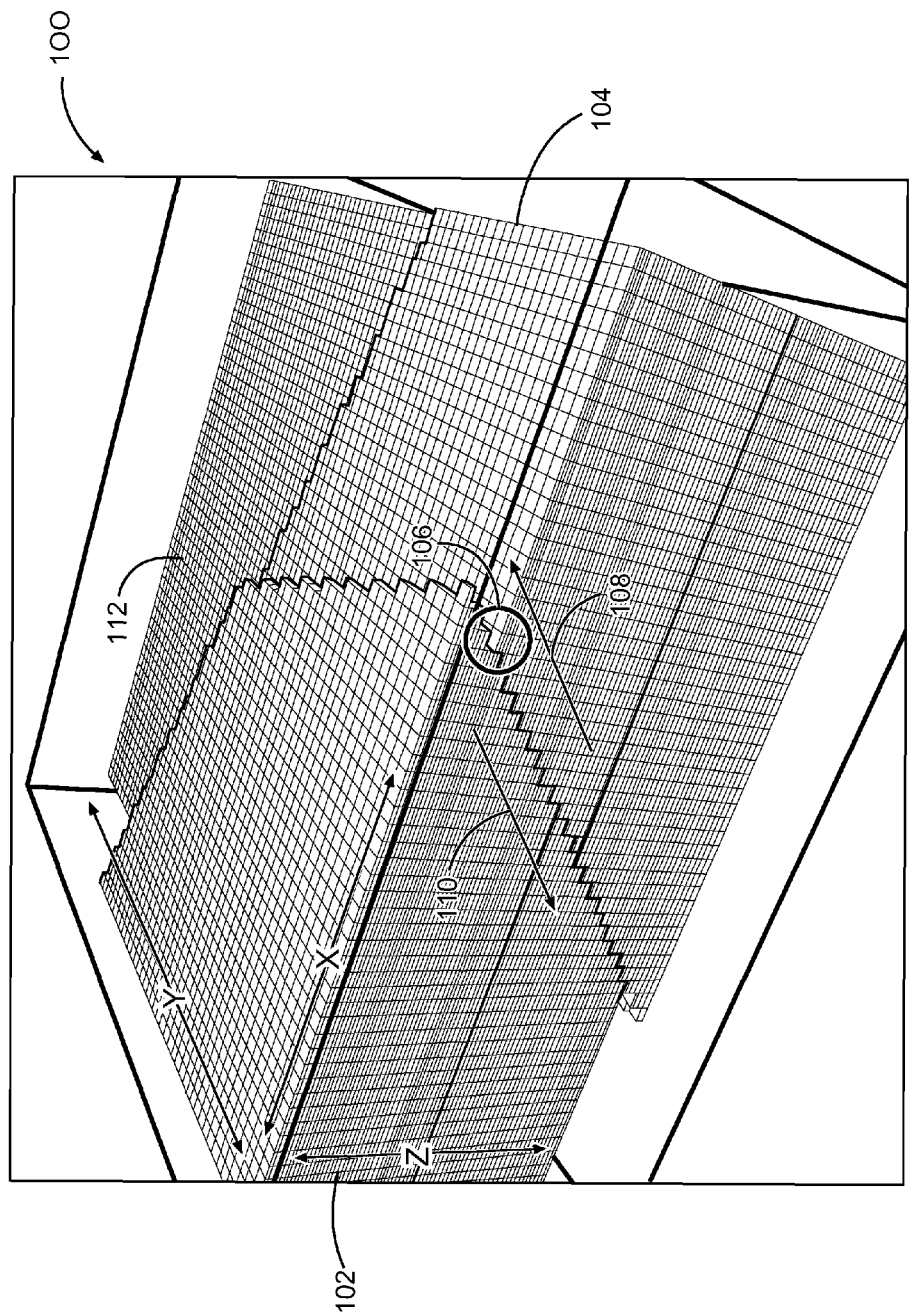
FIG. 1 is a map-view of a geographical formation, according to an example embodiment.

In various examples, a three-dimensional (3D) model may be stored that represents a geographical formation. For example, the model may represent a geographical formation that includes one or more faults and fault blocks. The model may be comprised of an array of cells that approximate the geographical formation. For example, there may be a series of stacked planes in the Z (height) direction that each contain a grid of cells in the X-Y direction. Each cell of the grid may have an index of [X, Y, Z]. FIG. 1 represents a visual representation of a stored 3D model (e.g., empty areas and fault blocks).

In addition to a coordinate, each cell in the model may have geographic data associated with the cell. For example, the geographic data may identify a fault block associated with the cell and a type of the fault (e.g., reverse, normal, cross, etc.). In other words, by retrieving the stored geographic data for a cell, an application or user may identify the fault block the cell is a part of, and what type of fault the cell is adjacent to. Geographic data of some cells may indicate that the grid at that position is empty and is not associated with a fault block.

The geographic data and cells in the 3D model may be represented by various data structures. For example a three-dimensional array data structure may be used where each entry in the array stores a data object that represents a cell (i.e., an entry of [5,5,5] in the array may correspond to position [5,5,5] in the model). The data object may include various data fields that identify the geographic data discussed above. Thus, if a program needs to access what fault block a cell is a part of, the program may access the data object stored in the array that represents the cell in question. Similarly a search may conducted of the three-dimensional array to retrieve all cells identified in a fault block and update their positions if necessary. Other data structures may also be used without departing from the scope of this disclosure (e.g., each fault block may be have its own data object that defines the boundaries of the fault block within the 3D model).

Additionally, a table or other data structure may be stored that identifies the various fault blocks of the geographic formation. The fault blocks may be identified by an alphanumerical sequence (e.g., 1, A1, ABC, etc.). The identifier may be what is used when a cell is associated with a fault block. For example, the geographic data associated with an entry in the 3D model may store the identifier of the fault block. The data on the fault blocks may also identify faults adjacent to the fault block.

Similarly, a table or other data structure may be stored that identifies the various faults in the geographic formation. The faults may be identified by an alphanumerical sequence (e.g., 1, A1, ABC, etc.), identify the number of fault blocks adjacent to the fault and their associated identifiers, and identify the location of the fault between cells of the fault blocks (e.g., identify cells of the 3D model on the sides of the fault for each Z level).

The data structures discussed above and programs accessing the structures may be implemented in one or more programming languages (e.g., Java, C/C++, etc.) and stored in one or more databases (e.g., relational, non-relational, flat file, etc.) or structured files (e.g., XML, etc.).

The 3D model may include more than one representative domain. One domain may be the geometric domain, which when modeled provides an approximate visual representation of the geographic area. Another domain may be a cell index domain in which manipulations of the fault blocks may be performed. The cell index domain may be a three dimensional area in which the fault blocks may be modeled. A change may be made in the cell index domain, as discussed further herein, but not change the geometric domain. For example, the size of the cell index domain may change from [10, 10, 5] to [12, 10, 5] while leaving the geometric domain unchanged. In some examples, cell index domain data refers to the cell, fault, and fault block data structures discussed above.

In various examples, following the creation of the 3D model based on a geographic formation, cells in reversed faulted areas may have duplicate X-Y coordinates in the cell index domain. For example, in FIG. 1, map-view 100 of a set of geocellular grids is illustrated with a reverse fault, fault block 102 and 104. As shown, at the point where the two fault blocks meet there is overlap between the X-Y coordinates. Accordingly, in some X-Y coordinates there may be duplicate Z coordinates in the index domain, where the two fault blocks meet (e.g., area 106). This may present problems when building a global grid.

In various examples of the techniques described herein, an "unfaulting" approach is used to restore the geographic formations to an unfaulted state. In some examples, the unfaulting process is performed in the cell index domain only and not in the geometric domain. In other words, in an example, the cell geometry does not change after unfaulting, but the grid indices are rearranged.

In various examples, fault blocks are the basic units used for unfaulting. An unfaulting operation uses a pair of fault blocks—one from each side of a fault and "moves" them to best align the two blocks, thereby minimizing the fault throws. For example, the alignment process may move the two blocks' indices in the direction of arrows 108 and 110. A block index may be considered the cells in the 3D model that represent a fault block. After the alignment, the cell indices in any dimension may increase monotonically, with no duplication. In other words, the geographic data of cells in the 3D model may be updated to reflect the new positions of the fault blocks. Furthermore, as discussed above, the size of the 3D model may also expand.

Figure 2A:
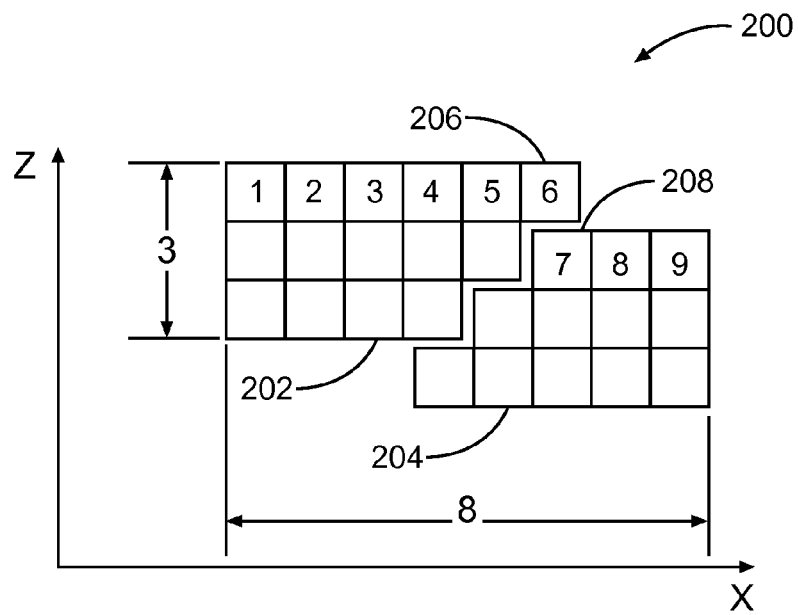
FIGS. 2A and 2B are example geocellular grids, according to various example embodiments.
Figure 2B:
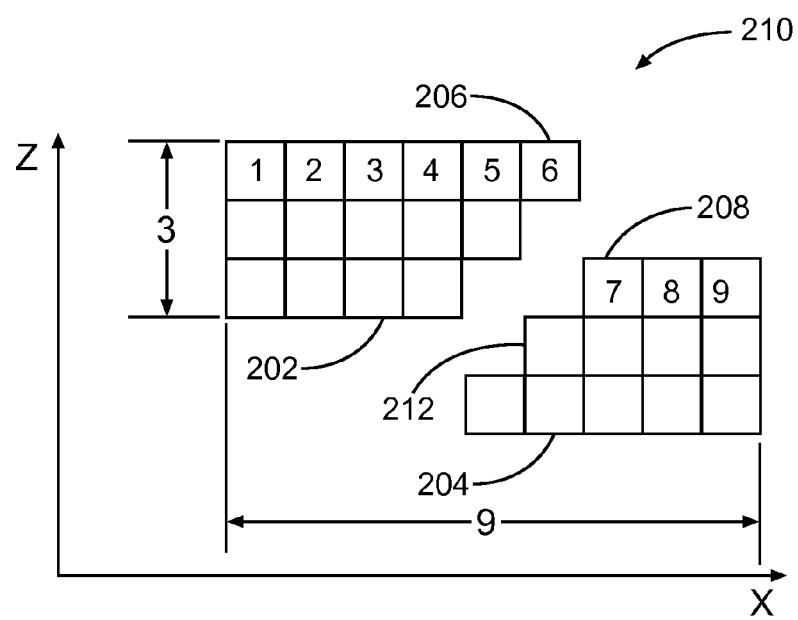

FIGS. 2A and 2B are example geocellular grids (e.g., cell indices), according to various example embodiments. Cell index 200 in FIG. 2A and cell index 210 in FIG. 2B illustrate fault blocks 202 and 204 before and after an unfaulting operation, respectively. The fault blocks have been simplified for illustration purposes of an unfaulting operation and only the X and Z axes are shown. As illustrated cell blocks 206 and 208 have overlapping X coordinates before unfaulting, but do not after unfaulting. In various examples, overlapping refers to relative levels between fault blocks (e.g., a level immediately below a row). Accordingly, even though there is a cell block (e.g., cell block 212) in fault block 204 that shares an X coordinate with cell block 206, this may not be considered overlap, in some examples. Additionally, one can see that grid 210 has been stretched in the X direction to nine cells after unfaulting, whereas the grid remains at three in the Z direction. More detailed description of how the fault blocks are moved is discussed herein.

In various examples, after completing the unfaulting for one pair of fault blocks, the two blocks become a single, unfaulted block. For example, the data structures representing the fault blocks may be updated to remove entries for the two fault blocks and an new entry representing the unfaulted block may be used in their places. Similarly, geographic data in the 3D model associated with the combined fault block may be updated to be associated with an identifier of the combined fault block. In some examples, the internal data is structured identically to what is contained in the original fault blocks. Thereafter, the processes may be repeated recursively to unfault all of the fault blocks in a fault network until there is a global grid with no fault throws (e.g., no faults). In various examples, the unfaulting process handles one pair of fault blocks at a time when addressing complicated fault networks. A recursive procedure may be used to unfault all the faults in the fault network.

Figure 3:
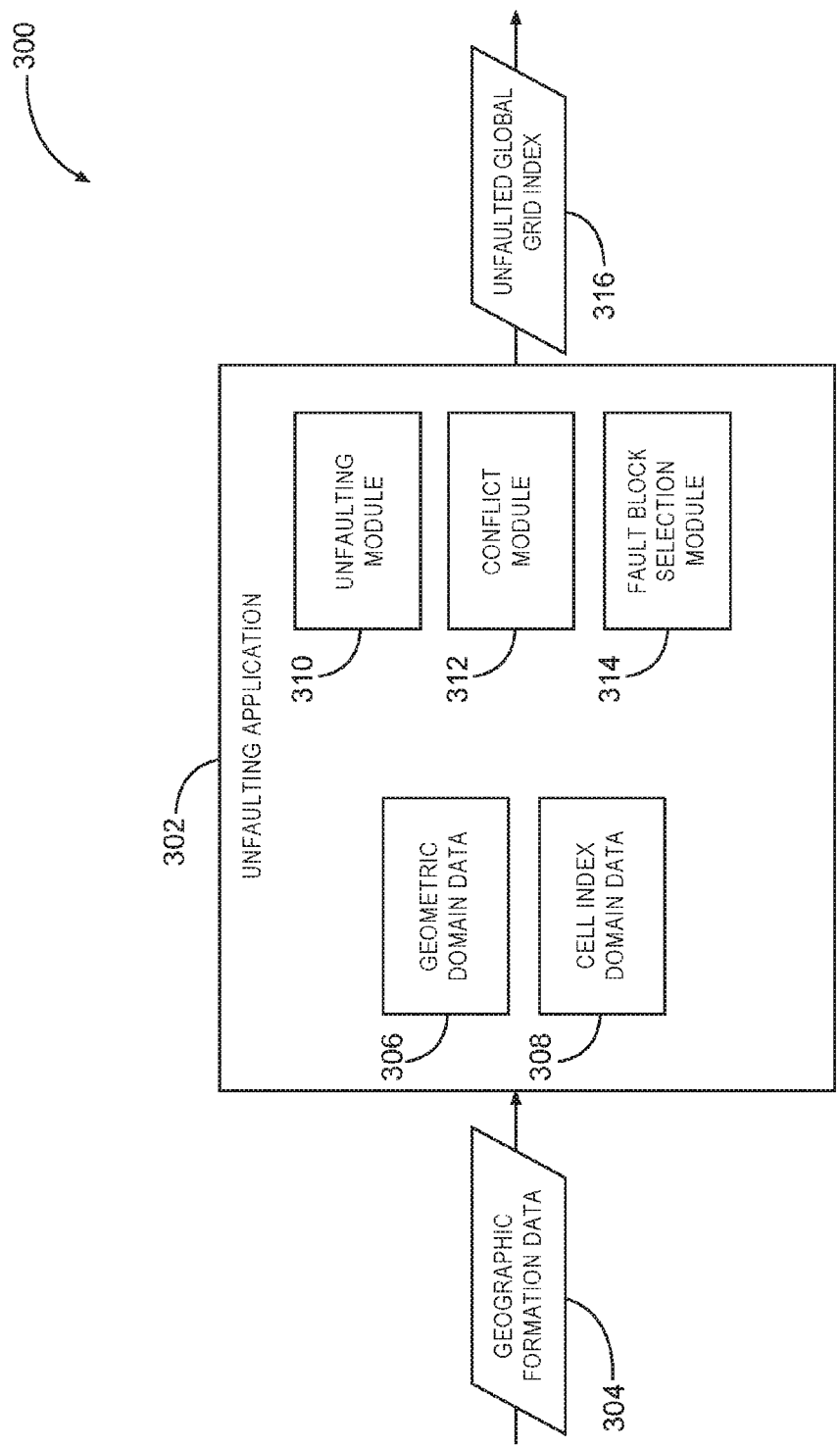
FIG. 3 is a block diagram illustrating an unfaulting application, according to an example embodiment.

FIG. 3 is a block diagram 300 illustrating an unfaulting application 302, according to an example embodiment. Illustrated is a representation of various components that may be included in unfaulting application 302. For example, unfaulting application 302 may include geometric domain data 306, cell index domain data 308, unfaulting module 310, conflict module 312, and fault block selection module 314. Also illustrated is input geographic formation data 304 and output unfaulted global grid index 316.

In various examples, unfaulting application 302 may be stored on a computer-readable storage device. In some examples, the storage device is a non-transitory medium. Some or all of the components of unfaulting application 302 may be stored as instructions on the storage device (e.g., modules 310-314). The instructions may be executed on at least one processor of a computing system. In some examples, the execution of the instructions is distributed among a plurality of processors. The processors may be general purpose processors or specialized processors such as graphical processing units. The processors may be located in the same computing system or distributed among a plurality of computing systems.

In some examples, a storage device of the computing system may store geometric domain data 306 and cell index domain data 308. Storage may also be distributed among a plurality of storage devices. In various examples, geometric domain data 306 and cell index domain data 308 are stored in a database (e.g., relational, non-relational, flat file, etc.), structure file (e.g., XML) or other storage format. Various operations of unfaulting application 302 may manipulate geometric domain data 306 and cell index domain data 308 on the storage device.

Figure 4:
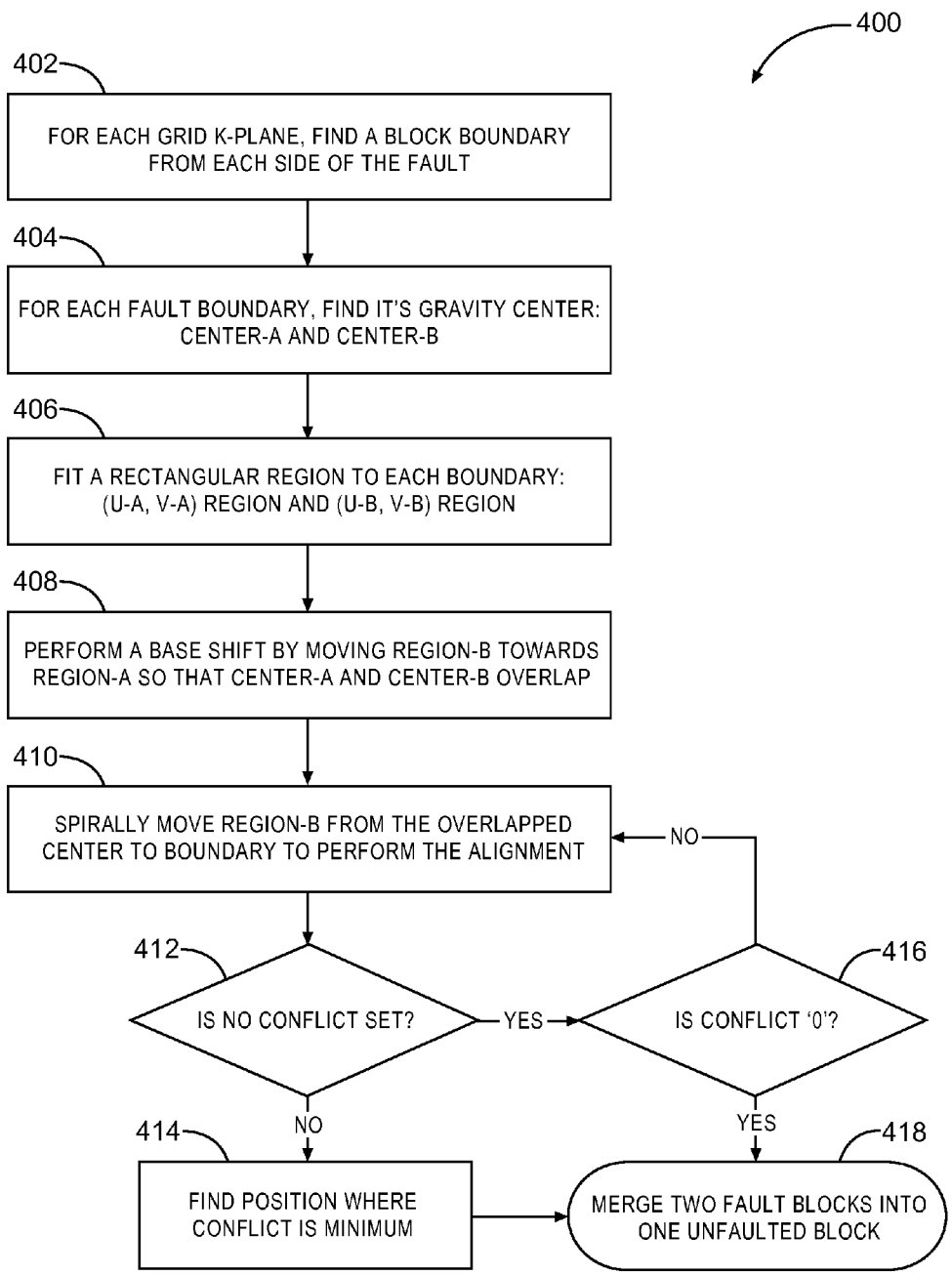
FIG. 4 illustrates a flowchart of a method of unfaulting a pair of fault blocks, according to an example embodiment.
Figure 5:
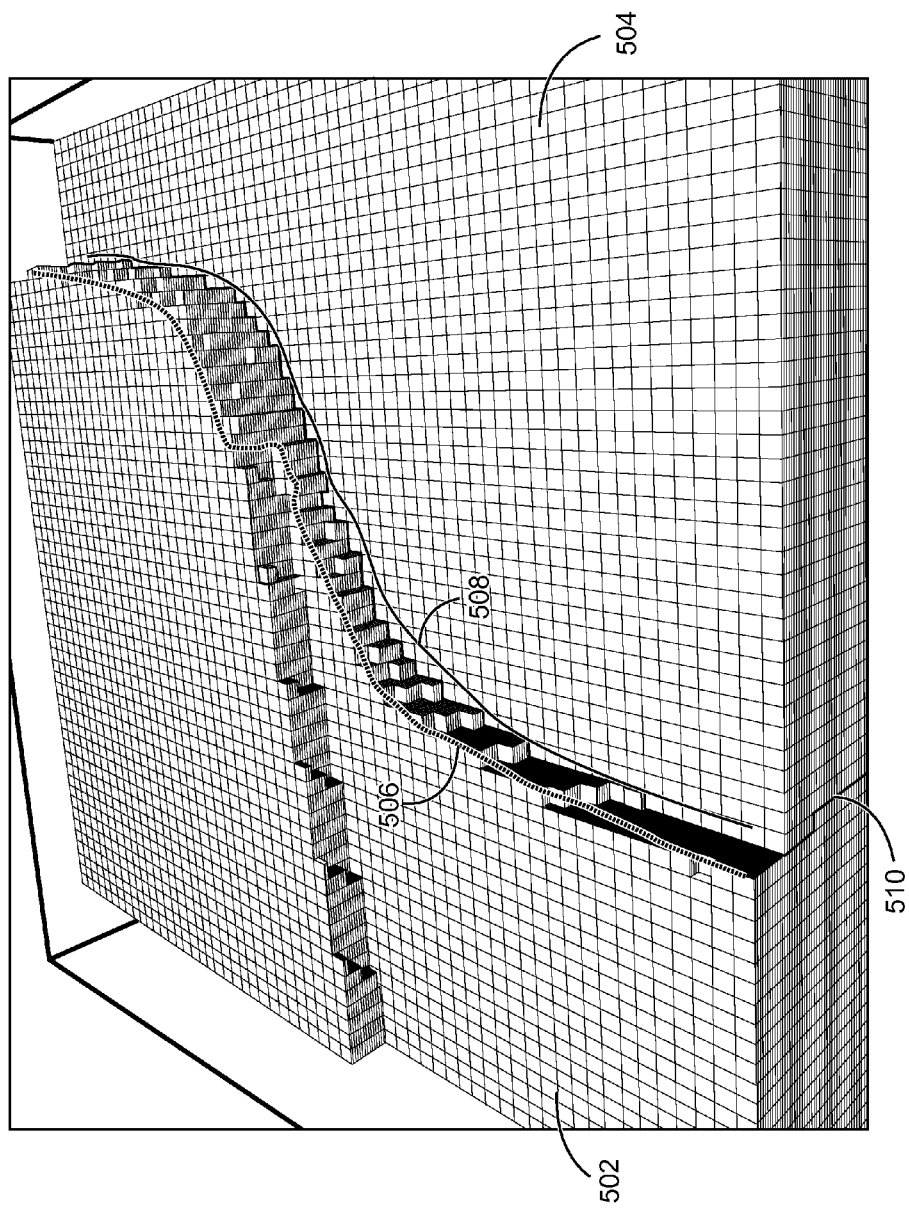
FIG. 5 illustrates a map-view of fault blocks with boundaries, according to an example embodiment.

FIG. 4 illustrates a flowchart 400 of a method of unfaulting a pair of fault blocks, according to an example embodiment. The method is described with respect to a single fault, but as discussed further herein, the method may be used multiple times for a network of faults.

In some examples, for each grid k-plane (e.g., horizontal plane in the Z direction) a block boundary is found from each side of the fault (402) to determine a fault boundary. In some examples, a fault boundary may be a path through cells of the 3D model closest to the fault for each z-layer of a fault block. For example, fault boundary 506 may include a line of cells of fault block 502 that are adjacent to fault 510. Similarly, fault boundary 508 may include a line of cells of fault block 504 that are adjacent to the other side of the fault. In some examples, the lines may follow the highest (e.g., highest Z value) cell of a that is adjacent to a fault. In various examples, a data structure representing the fault boundary may include a series of [X, Y, Z] coordinates tracing the fault boundary.

In some examples, the pair of block boundaries (e.g., fault boundaries 506 and 508) for the k-plane slice represents the portion of a fault polygon on the slice. A fault polygon may be considered the region between two fault blocks that outline the fault between two fault blocks above the top layer of one of the fault blocks.

Figure 6:
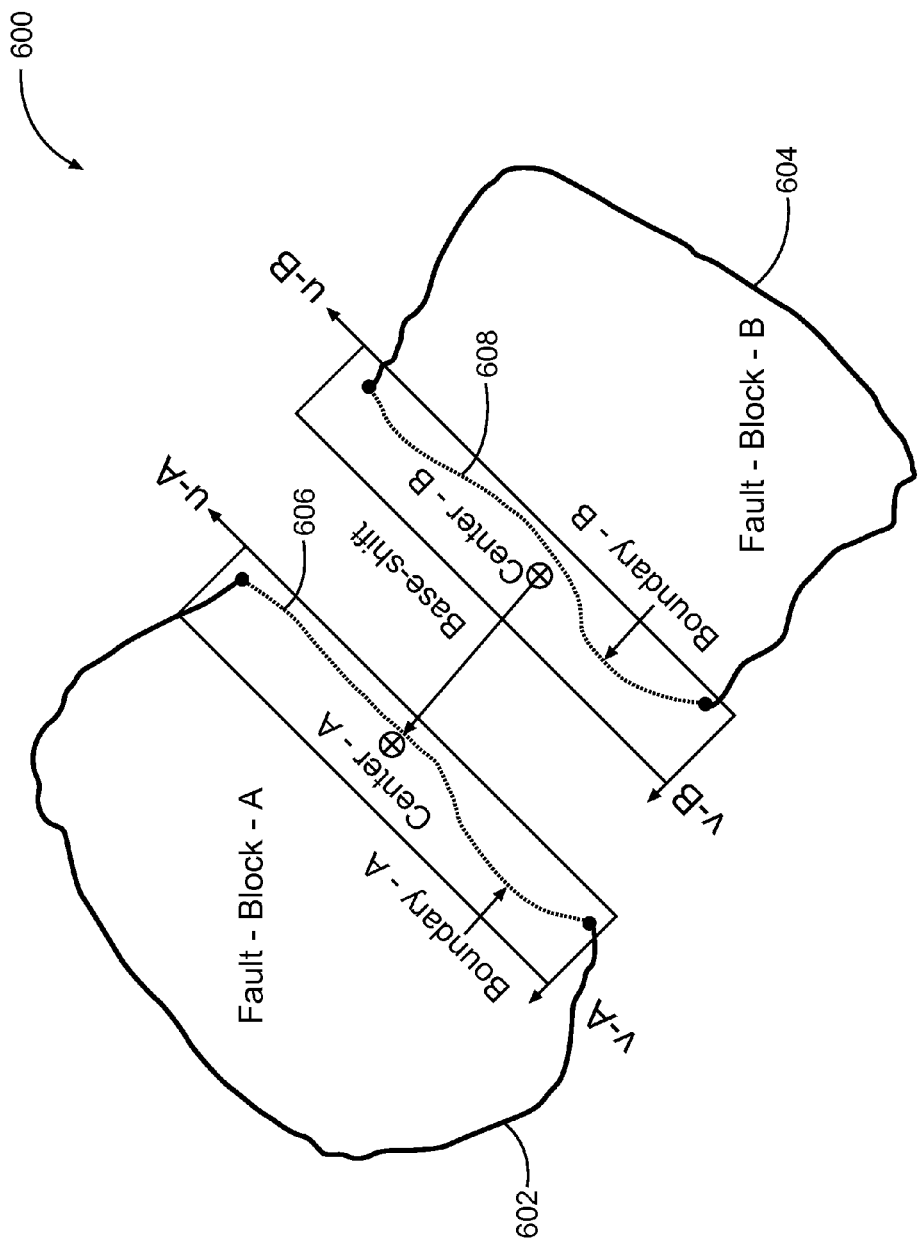
FIG. 6 is a diagram of two fault blocks, according to an example embodiment.

In various examples, for each fault boundary the gravity center is found (404). For example, FIG. 6 illustrates a top-view 600 of fault blocks 602 and 604 with fault boundaries 606 and 608, respectively. As illustrated, the center of boundary 606 is labeled "center-A" and the center of boundary 608 as "center-B." The gravity center may be found using various known techniques without departing from the scope of this disclosure.

In various examples, a rectangular region (e.g., bounding box) is fit to each boundary: (u-A, v-A) region and (u-B, v-B) region (406). Then, a base-shift may be performed in which region A is moved towards region B such that center-A and center-B overlap (408). In various examples, "moving" means updating the cells of a plurality of cells in a fault block. For example, if a cell of a fault block had an index of [5, 6, 10] a movement may mean that the index of the cell is now [6, 7, 10]. All cells in the fault block may move relative to a movement of an individual cell (e.g., if one cell of a fault block is moved left one coordinate, all cells are moved left one coordinate).

In various examples, after the base-shift, the two regions are fine-tuned to find an optimized position/alignment. The alignment may move all slices of the fault block together. For example, region-B may be spirally moved from the overlapped center of the boundary to perform the alignment (410). In some examples, spirally moving the region guarantees that if matching factors of two positions are the same, the one with the smaller shift is used as the final alignment.

Figure 7:
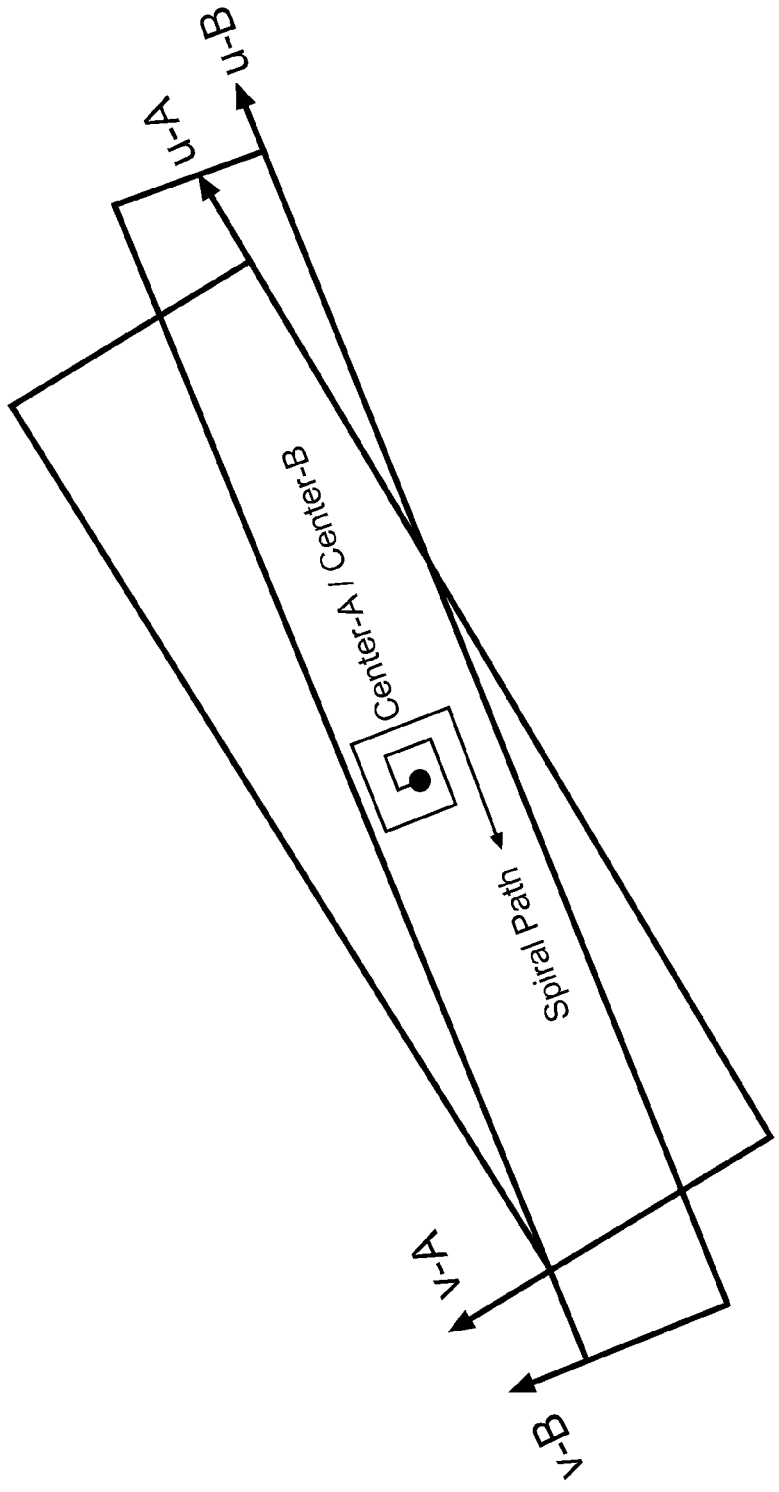
FIG. 7 is an illustration of aligning two fault blocks, according to an example embodiment.

FIG. 7 illustrates an example of movement along a spiral path. The amount of movement in each direction of the spiral may be set according to a user preference (e.g., one cell). As seen in FIG. 7, the movement may begin in a direction perpendicular to "u-B" and proceed in 90 degree turns in an expanding spiral. In various examples, other movement patterns (e.g., a curved spiral, may be used to align the two regions.

In order to determine when to stop the alignment, a user preference may be set as to the level of conflict (described in more detail below) allowed between two fault blocks. Unfaulting application 302 may retrieve the user preference and determine if the "no conflict" preference has been set (412). If the preference has been set, a check may be made to determine if the conflict of the two fault blocks is '0' (416). If the conflict is '0', unfaulting application 302 may merge the two fault blocks into one unfaulted block (418). Merging may include updating fault block identification data of cells in the two fault blocks to be the same. If the conflict is not '0', flow may go back to operation 410 to continue to spirally move the fault block until a conflict value of '0' is achieved.

In various examples, if the "no conflict" preference has not been set, the position where conflict is at a minimum may be found (414) before the fault blocks are merged together. A preference may also set as to the maximum distance a region may be moved (e.g., spirally moved) in which to find a minimum conflict. In some examples, a user may set a preference as the maximum level of conflict allowed. Thus, an iterative process may be used to try numerous positions of the two fault blocks until a stopping condition is achieved (e.g., no conflict or minimal conflict). In various example, a fault block may need to be moved beyond the current dimensions of the global grid in order to satisfy the user preference related to conflict factors. In such instances the cell index domain of the global grid may be expanded in the X-Y directions to accommodate such a move.

Figure 8:
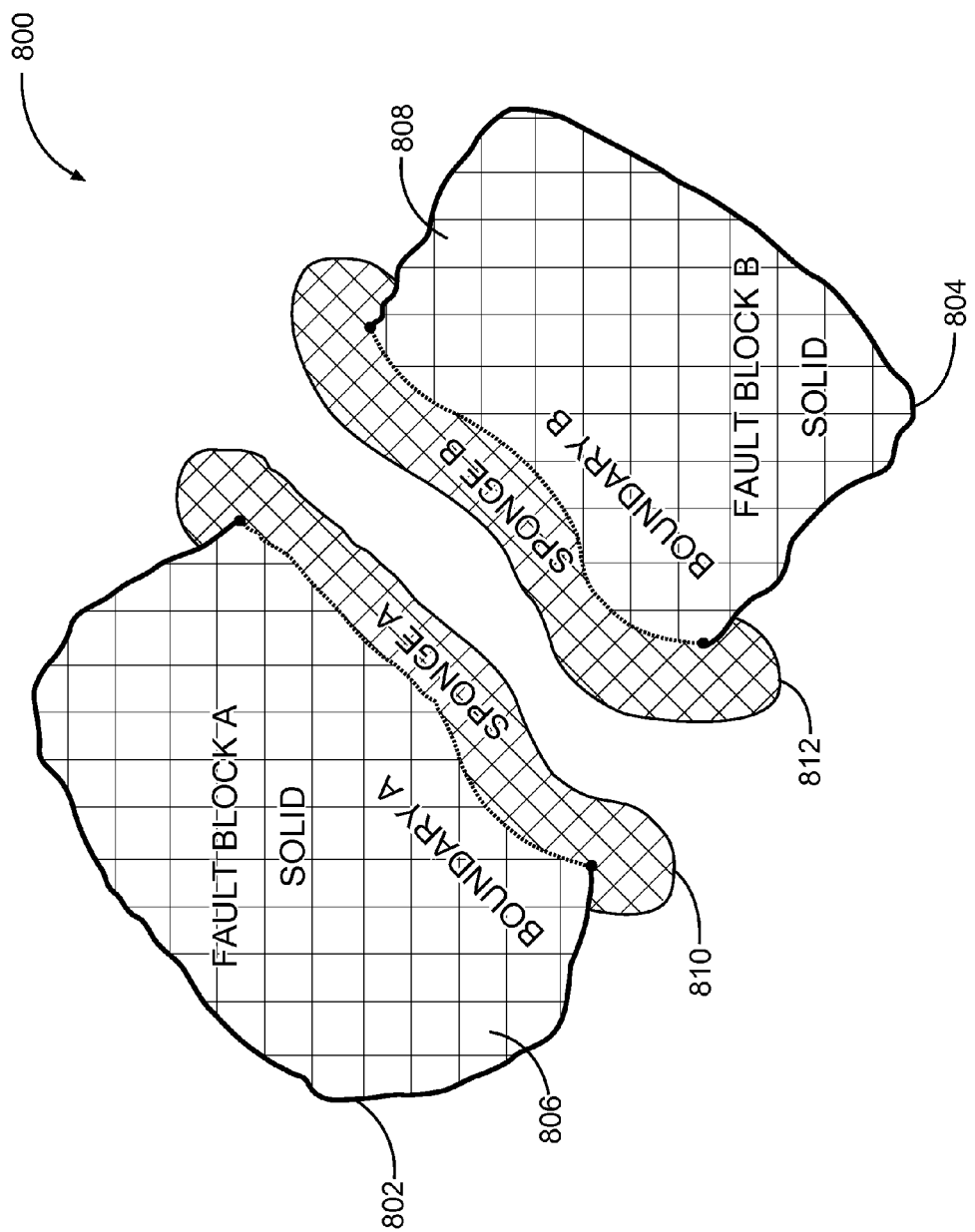
FIG. 8 is a diagram of two fault blocks, according to an example embodiment.

FIG. 8 illustrates an example overhead view 800 of two fault blocks 802, 804 that have been divided into three sub-areas: (1) solid areas 806, 808; (2) sponge areas 810, 812; and empty areas. To determine a conflict value, each fault block may first be divided into these sub-areas. For example, the sponge area may be defined around the boundary of each fault block. The sponge area may be a defined (e.g., user preference) distance away from the outside of the boundary of a fault block. The solid area may be the area inside the boundary and the empty area may be everything else. When shifting region-B during the optimization alignment, any one of the 3 sub-areas from each side may overlap each other. A conflict factor may then be calculated based on which areas overlap with each area.

In various example, the conflict area for each pixel (e.g., cell) may be determined according to the following pseudo code:

```
float conflict_factor = 0.0;
boolean solid_conflict = false;
if (sideA == SOLID && sideB == SOLID) {
    conflict_factor += solid_factor;
    solid_conflict = true;
} else if (sideA != SOLID && sideB != SOLID) {
    if (sideA == SPONGE) {
        conflict_factor += sponge_factor;
    }
    if (sideB == SPONGE) {
        conflict_factor += sponge_factor;
    }
}
```

In various examples, the solid_factor and sponge_factor may have predefined values according to a user preference. In some examples, the solid_factor is 10.0 and sponge factor is 1.0.

In various examples, when a conflict factor is calculated using the above pseudo code and with a solid factor values of 10.0 and sponge factor of 1.0, the following characteristics appear when examining two pixels for conflict: (1) when both are solid, there is a large conflict factor; (2) when both are "sponge", there is some conflict factor, but not as large; (3) when one (either side) is solid and the other is sponge or empty, no value is added to the conflict factor; and (4) when both are empty, no value is added to the conflict factor. Various other factor values may be used to achieve different goals.

In some examples, the first characteristic above means "pushing away from each other" with a larger force when solid parts from both sides overlap. The characteristic means "pulling both sides closer" with some force—not as large— when solid parts from both sides are too far from each other.

Additionally, it may be seen that the algorithm attempts to make the third characteristic occur when possible (i.e., one side is sponge and one side is solid). In some examples in which it is assumed that the boundaries of both sides are like dogs teeth, then the maximum occurrence of the third criterion will try to make both sides well aligned with no or a small solid portion overlap, and with a minimal gap in between. This may be achieved by choosing the minimum conflict factor defined above.

In some examples, the above conflict definition is for one pixel. The processing algorithm may use the summation of the conflict factors for all pixels in one grid k-plane and then summed again for all the grid k-planes by selecting the position (e.g., using the alignment discussed above) of the fault blocks where there is a minimal summed conflict factor. As discussed earlier, a user may set a level of conflict preference of "strictly no conflict" or "allow minimal conflict." If the "strictly no conflict" choice is selected, the algorithm may exclude any position if any single pixel meets the first criterion, or it makes the solid_factor infinitively large.

In various examples, the unfaulting process is used on two fault blocks at a time. When more than one fault exists in the cell index domain, an algorithm may be used to calculate an order of fault blocks to unfault. FIG. 1 illustrates a simple example of multiple faults; when only two faults occur. In map view 100, the primary fault divides fault block 112 in the back, and blocks 102/104 in front. The secondary fault divides the front part into fault blocks 102/104. When the unfaulting process is applied, the secondary fault is unfaulted first—logically merging fault blocks 102/104, with which it applies the unfaulting process again with fault block 112. Eventually, a single global grid is generated with no faulted blocks. In various examples, inter-locked fault blocks are unlocked first in a complex fault network and a check is made to make sure there is a solution by finding one proper pair of fault blocks at any time.

Figure 9:
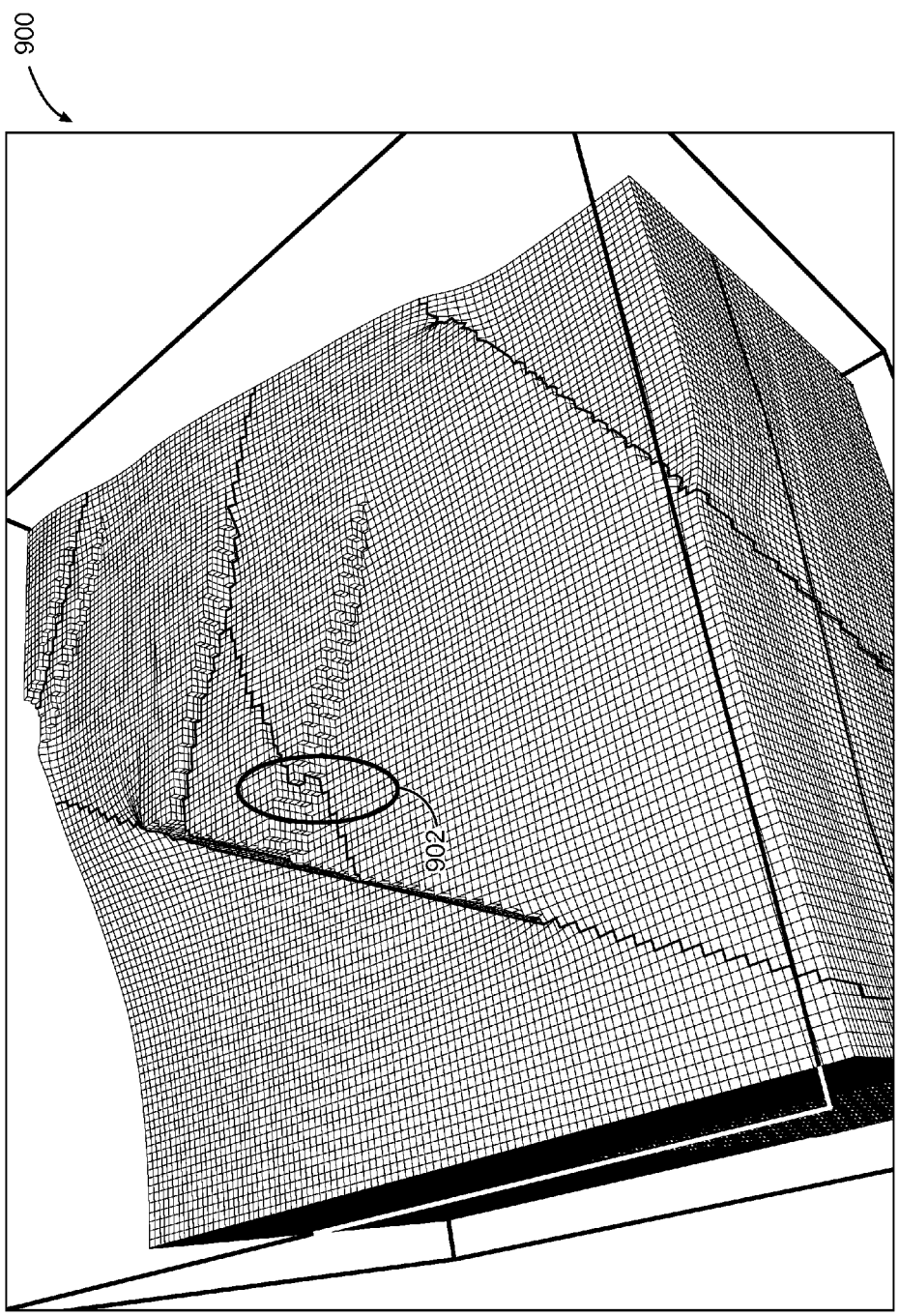
FIG. 9 is a map-view of a geographic formation with multiple faults, according to an example embodiment.
Figure 10:
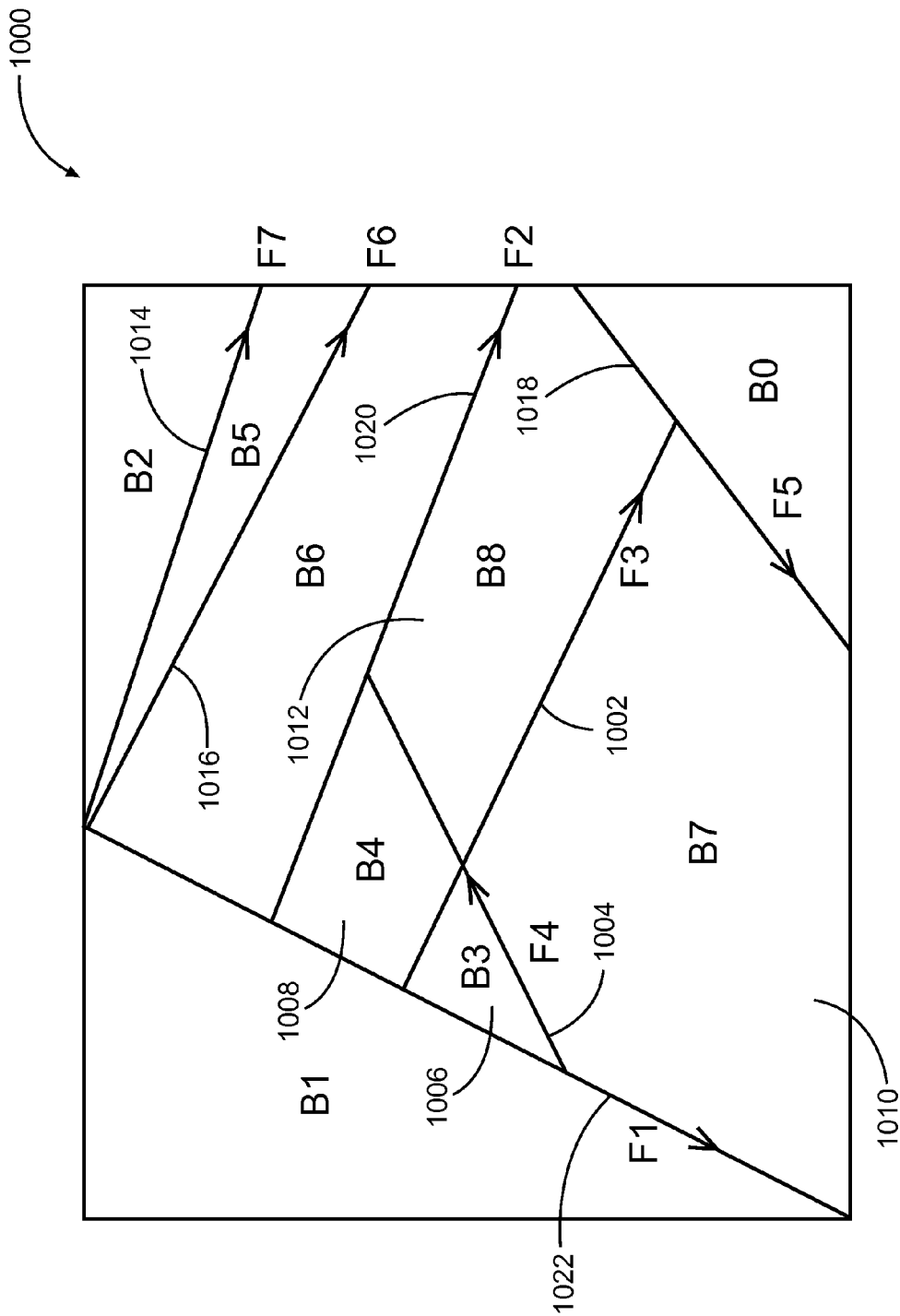
FIG. 10 is a diagram of a fault topology, according to an example embodiment.

However, real fault networks are generally more complicated than that illustrated in FIG. 1. For example, FIG. 9 illustrates a map-view of fault network 900 and FIG. 10 illustrates corresponding topology 1000. As illustrated, with respect to FIG. 10, fault 1002 and 1004 are a pair of cross faults, which have fault blocks 1006-1012 associated with them. The corresponding cross point in FIG. 9 is highlighted be region 902.

Figure 11:
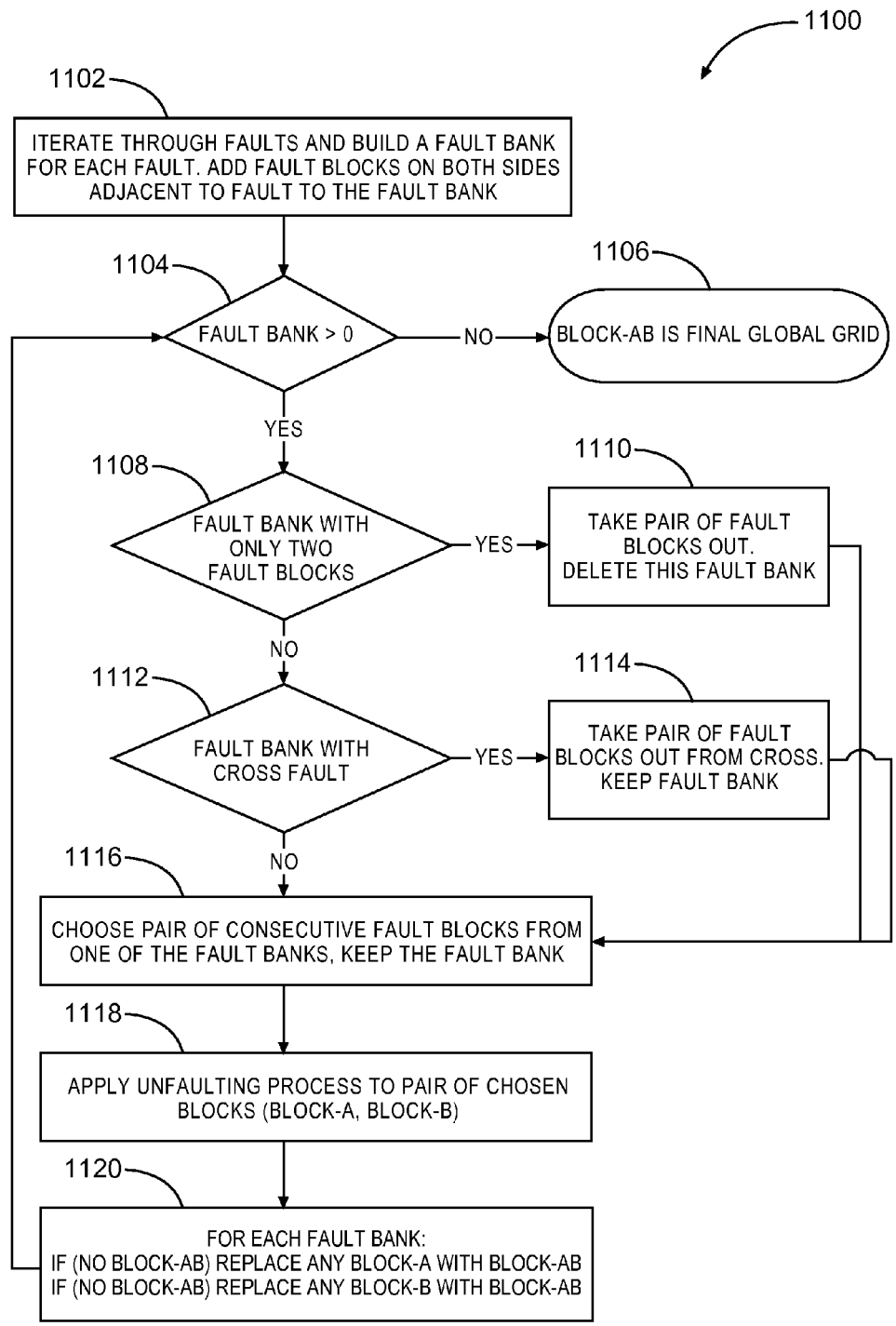
FIG. 11 is a flowchart of a method of selecting an order of fault blocks, according to an example embodiment.

In various examples, FIG. 11 is a flowchart of an algorithm that may be used to perform unfaulting in a fault network. The algorithm may be used to determine which fault blocks to select next to unfault in a complex fault network. First, a fault bank data structure may be generated for each fault in a fault network. For each fault bank, fault blocks on both sides adjacent to the fault are added to the fault bank data structure (1102). The fault bank may be a stored data structure such as an array in which each entry is a fault block. Each fault block in the fault bank may also have data stored such as the type of fault for each side of the fault block, and which fault blocks are adjacent to the fault. The fault banks and fault blocks may have identification stored in the data structure (e.g., fault bank 1 has fault blocks A, B, and C). The fault bank may also have data indicating the number of fault blocks in the fault bank.

After building the fault banks and while there is still at least one fault bank (1104) the fault banks are checked to see there is a fault bank with only two fault blocks (1108). If so, the pair of fault blocks are taken out of the fault bank and the fault bank is removed (1110). Then, flow moves to operation 1118 in which the two fault banks are unfaulted.

In some examples, if there is not a fault bank with only two fault blocks, a check is made to determine if there is a fault bank with a cross fault (1112). For example, the fault banks may be iterated through to determine what type of faults are still present in fault blocks left in the fault bank. If a cross fault is found, a pair of fault blocks of the cross fault are taken out of the fault bank and the fault bank is kept (1114). Then, flow moves to operation 1118 in which the two chosen fault banks are unfaulted.

In example, if there is no fault bank with only two fault blocks or a fault bank with a cross fault, a pair of consecutive blocks from one side of a fault bank may be chosen (1116). For example, blocks B and C of fault bank 2 as stored in a data structure. In various examples, the pair of fault blocks chosen by operations 1108, 1112, or 1116, are unfaulted using the process described herein (1118) to generate block-AB.

In various examples, the remaining fault banks are iterated through and updated such that if there no block-AB, any block-A is replaced with block AB and if there is no block-AB, any block-B is replaced with block-AB (1120). In other words, blocks A and B are merged such that they are single logical block even if their underlying geometry has not changed in the geometric domain. Flow is then returned back to operation 1104 to determine if there are any fault banks remaining. In some examples, when algorithm 1100 is applied to the fault network in FIG. 10, the unfaulting order in terms of fault numbers is 1014, 1016, 1002, 1004, 1018, 1020, and 1022.

In various examples, processes described herein may be performed by components illustrated in FIG. 3. For example, a computer-implemented process may start with receiving geographic formation data 304 with the faults, the type of faults, fault blocks adjacent to the faults, and storing the data on a storage device in the two domains: (1) geometric domain data; and (2) cell index domain data. Then, the fault block selection module may retrieve the cell index domain data from the storage device and generate an order of fault blocks to unfault as discussed above.

In various examples, the unfaulting module may then begin the unfaulting process on two of the fault blocks. This may include the base-shift in which the center of gravity of a fault boundary of one of the two blocks is aligned with the center of gravity of a fault boundary of the other fault block of the two fault blocks. The base-shift may include updating the cell index domain on the storage device for each cell in the shifted fault block with a new position. In various examples, the base-shift may include expanding the size of the global cell index domain.

In various examples, the conflict module may perform a fine tuning alignment of the blocks according to a level of conflict preference. For example, one of the fault blocks may be moved in defined increments around the center of gravity of a fault boundary. The defined increments may be a pattern such as a spiral. In some examples, the alignment takes place in the X and Y directions, but Z remains unchanged. After each alignment, the conflict module may calculate a level of conflict between the two fault blocks, and if the level of conflict preference has been met (e.g., is zero if the level of conflict is "no conflict"), the alignment stops. In some examples, the alignment continues for a predetermined amount of moves or distance and the position that yields the least conflict is chosen for the two fault blocks.

In various examples, after the alignment has concluded, the two fault blocks are merged to become a single block. This may include updating the relevant fault bank and data in the cell index domain. Upon unfaulting each pair of fault blocks in the order determined by the fault block selection module, a single unfaulted global grid index may be generated.

In various examples, although the unfaulting method above has been described as a way to solve the index duplication problem caused by reverse faulting, one advantage of this unfaulting method is that it treats both reverse and normal faults, even vertical faults, in the same manner by optimizing the block indices alignment. In some examples, fault blocks created by normal faulting do not result in index overlap. Because most algorithms do not perform a special alignment, unwanted "empty" cells may be created near both sides of normal fault when building the global grid. Application of the described method may squeeze fault blocks across normal fault closer, thus no, or with minimum, unwanted "empty" cells in between, and well aligned; stretch fault blocks across reverse fault apart, thus no, or with minimum, duplication of cell indices in between, and well aligned; and better align fault blocks across vertical faults based on boundary geometry.

Certain embodiments are described herein as including logic or a number of components, modules, or mechanisms. Modules may constitute either software modules (e.g., code embodied (1) on a non-transitory machine-readable medium or (2) in a transmission signal) or hardware-implemented modules. A hardware-implemented module is tangible unit capable of performing certain operations and may be configured or arranged in a certain manner. In example embodiments, one or more computer systems (e.g., a standalone, client or server computer system) or one or more processors may be configured by software (e.g., an application or application portion) as a hardware-implemented module that operates to perform certain operations as described herein.

In various embodiments, a hardware-implemented module may be implemented mechanically or electronically. For example, a hardware-implemented module may comprise dedicated circuitry or logic that is permanently configured (e.g., as a special-purpose processor, such as a field programmable gate array (FPGA) or an application-specific integrated circuit (ASIC)) to perform certain operations. A hardware-implemented module may also comprise programmable logic or circuitry (e.g., as encompassed within a general-purpose processor or other programmable processor) that is temporarily configured by software to perform certain operations. It will be appreciated that the decision to implement a hardware-implemented module mechanically, in dedicated and permanently configured circuitry, or in temporarily configured circuitry (e.g., configured by software) may be driven by cost and time considerations.

Figure 12:
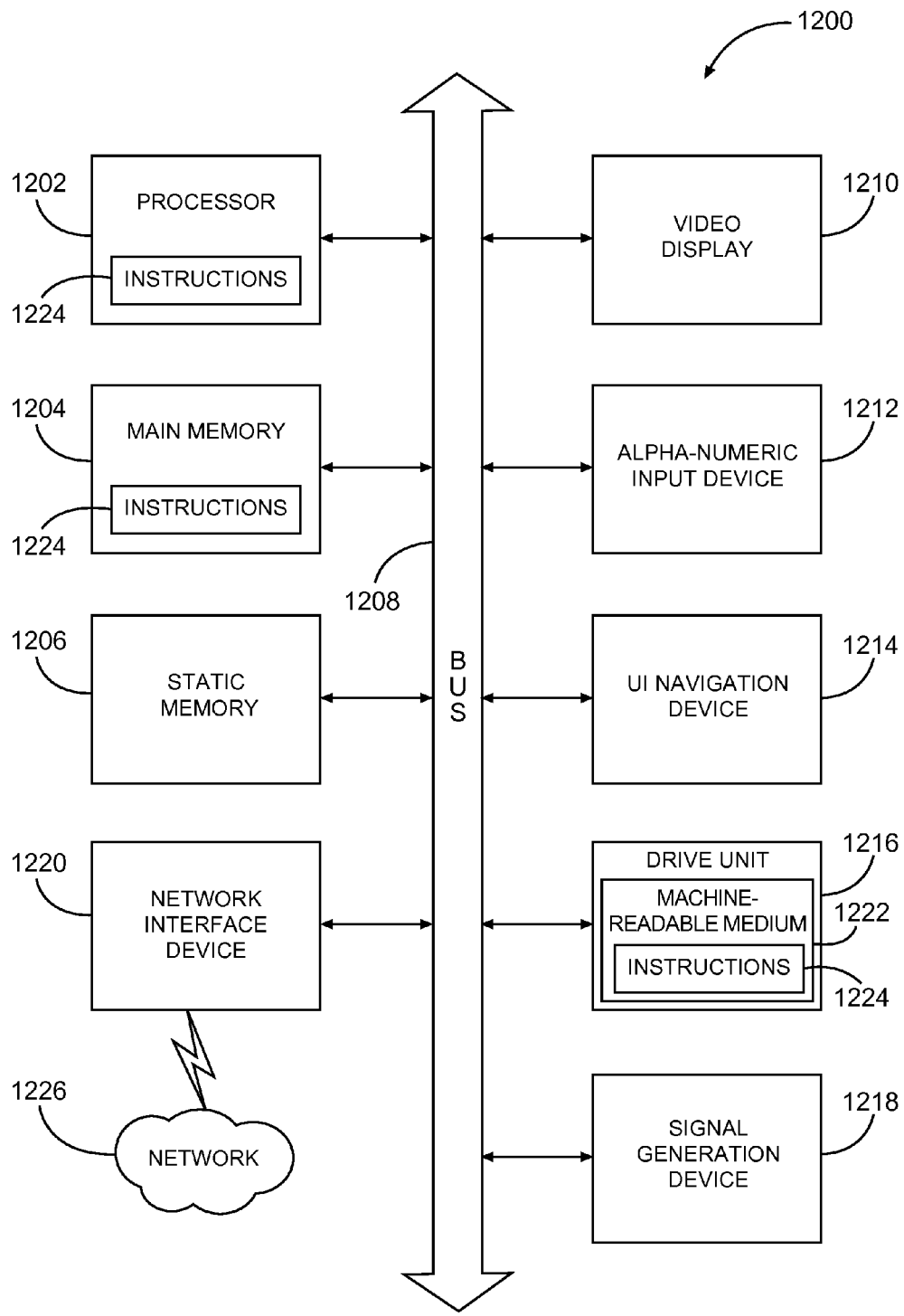
FIG. 12 is a block diagram of machine in the example form of a computer system within which a set instructions, for causing the machine to perform any one or more of the methodologies discussed herein, may be executed.

FIG. 12 is a block diagram of a machine in the example form of a computer system 1200 within which instructions, for causing the machine to perform any one or more of the methodologies discussed herein, may be executed. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1200 includes a processor 1202 (e.g., a central processing unit (CPU), a graphics processing unit (GPU) or both), a main memory 1204 and a static memory 1206, which communicate with each other via a bus 1208. The computer system 1200 may further include a video display unit 1210 (e.g., a liquid crystal display (LCD) or a cathode ray tube (CRT)). The computer system 1200 also includes an alphanumeric input device 1212 (e.g., a keyboard), a user interface (UI) navigation device 1214 (e.g., a mouse), a disk drive unit 1216, a signal generation device 1218 (e.g., a speaker) and a network interface device 1220.

The disk drive unit 1216 includes a machine-readable medium 1222 on which is stored one or more sets of instructions and data structures (e.g., software) 1224 embodying or utilized by any one or more of the methodologies or functions described herein. The instructions 1224 may also reside, completely or at least partially, within the main memory 1204 and/or within the processor 1202 during execution thereof by the computer system 1200, the main memory 1204 and the processor 1202 also constituting machine-readable media.

While the machine-readable medium 1222 is shown in an example embodiment to be a single medium, the term "machine-readable medium" may include a single medium or multiple media (e.g., a centralized or distributed database, and/or associated caches and servers) that store the one or more instructions or data structures. The term "machine-readable medium" shall also be taken to include any tangible medium that is capable of storing, encoding or carrying instructions for execution by the machine and that cause the machine to perform any one or more of the methodologies of the present invention, or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including by way of example semiconductor memory devices, e.g., Erasable Programmable Read-Only Memory (EPROM), Electrically Erasable Programmable Read-Only Memory (EEPROM), and flash memory devices; magnetic disks such as internal hard disks and removable disks; magneto-optical disks; and CD-ROM and DVD-ROM disks.

The instructions 1224 may further be transmitted or received over a communications network 1226 using a transmission medium. The instructions 1224 may be transmitted using the network interface device 1220 and any one of a number of well-known transfer protocols (e.g., HTTP). Examples of communication networks include a local area network ("LAN"), a wide area network ("WAN"), the Internet, mobile telephone networks, Plain Old Telephone (POTS) networks, and wireless data networks (e.g., WiFi and WiMax networks). The term "transmission medium" shall be taken to include any intangible medium that is capable of storing, encoding or carrying instructions for execution by the machine, and includes digital or analog communications signals or other intangible media to facilitate communication of such software.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A method comprising:
   storing on a storage device, at least one data structure representing a plurality of fault blocks associated with one or more faults in a geographic formation;
   selecting two fault blocks of the plurality of fault blocks associated with a fault of the one or more faults;
   changing the position of a first of the two fault blocks in the at least one data structure, using at least one processor, representative of a shift of the first fault block towards the other fault block of the two fault blocks to position the center of gravity of a fault boundary of the first fault block with the center of gravity of a fault boundary of the other fault block;
   after performing the shift, aligning the first fault block with the other fault block according to a permitted level of conflict between fault blocks; and
   updating the at least one data structure to indicate a merging of the two selected fault blocks into an unfaulted block after the alignment.

2. The method of claim 1, further comprising:
   determining the fault boundary of the first fault block by determining locations of cells of the first fault block on a side of the fault.

3. The method of claim 1, wherein aligning the first fault block with the other fault block according to a permitted level of conflict between fault blocks comprises:
   dividing each of the two fault blocks into at least three areas including a solid area, a sponge area, and an empty area; and
   calculating a conflict between the two fault blocks according to an overlap of the three areas of the two fault blocks in a current position of the fault blocks during alignment.

4. The method of claim 3, wherein when a solid area of the first fault block overlaps a solid area of the other fault block, the calculated conflict is greater than when a sponge area of the first fault block overlaps a solid area of the other fault block.

5. The method of claim 3, wherein aligning further includes:
   changing the position of the first fault block, in the at least one data structure representative of moving the first fault block, in defined increments around the overlapped centers of gravity until there is no conflict based on the permitted the level of conflict being zero.

6. The method of claim 5, wherein the direction of the defined increments proceeds in a spiral pattern around the overlapped centers of gravity.

7. The method of claim 1, further comprising:
   generating a fault bank data structure for each fault of the one or more faults in the geometric formation, wherein fault blocks adjacent to a respective fault are added to the fault bank associated with the respective fault.

8. The method of claim 7, wherein selecting the two fault blocks of the plurality of fault blocks associated with the fault comprises:
   retrieving the fault bank data structure associated with the fault; and
   determining that the fault bank only includes the two fault blocks.

9. The method of claim 7, wherein each fault bank data structure includes data indicating the type of fault the fault bank represents and number of fault blocks in the fault bank.

10. The method of claim 9, further comprising:
    determining a pair of fault blocks to unfault based on the type of fault and number of fault blocks in a fault bank.

11. A non-transitory computer-readable storage device with instructions stored thereon, which when executed by one or more processors, configure the one or more processors to perform operations comprising:
    storing on a storage device, at least one data structure representing a plurality of fault blocks associated with one or more faults in a geographic formation;
    selecting two fault blocks of the plurality of fault blocks associated with a fault of the one or more faults;
    changing the position of a first of the two fault blocks in the at least one data structure, using at least one processor, representative of a shift of the first fault block towards the other fault block of the two fault blocks to position the center of gravity of a fault boundary of the first fault block with the center of gravity of a fault boundary of the other fault block;
    after performing the shift, aligning the first fault block with the other fault block according to a permitted level of conflict between fault blocks; and
    updating the at least one data structure to indicate a merging of the two selected fault blocks into an unfaulted block after the alignment.

12. The non-transitory computer-readable storage device of claim 11, wherein the operations further comprise:

determining the fault boundary of the first fault block by determining locations of cells of the first fault block on a side of the fault.

13. The non-transitory computer-readable storage device of claim 11, wherein the operation of aligning the first fault block with the other fault block according to a permitted level of conflict between fault blocks comprises:

dividing each of the two fault blocks into at least three areas including a solid area, a sponge area, and an empty area; and calculating a conflict between the two fault blocks according to an overlap of the three areas of the two fault blocks in a current position of the fault blocks during alignment.

14. The non-transitory computer-readable storage device of claim 13, wherein when a solid area of the first fault block overlaps a solid area of the other fault block, the calculated conflict is greater than when a sponge area of the first fault block overlaps a solid area of the other fault block.

15. The non-transitory computer-readable storage device of claim 11, wherein the operation of aligning further comprises:

changing the position of the first fault block, in the at least one data structure representative of moving the first fault block, in defined increments around the overlapped centers of gravity.

16. A system comprising:

one or more processors;

a storage device with instruction stored thereon; and wherein when the instructions are executed by the one or more processors, the one or more processors are configured to perform operations comprising:

storing on the storage device, at least one data structure representing a plurality of fault blocks associated with one or more faults in a geographic formation;

selecting two fault blocks of the plurality of fault blocks associated with a fault of the one or more faults;

changing the position of a first of the two fault blocks in the at least one data structure, using at least one processor, representative of a shift of the first fault block towards the other fault block of the two fault blocks to position the center of gravity of a fault boundary of the first fault block with the center of gravity of a fault boundary of the other fault block;

after performing the shift, aligning the first fault block with the other fault block according to a permitted level of conflict between fault blocks; and updating the at least one data structure to indicate a merging of the two selected fault blocks into an unfaulted block after the alignment.

17. The system of claim 16, wherein the fault boundary of the first fault block includes locations of cells of the first fault block on a side of the fault.

18. The system of claim 16, further comprising a fault bank data structure that identifies the two fault blocks stored on the storage device and wherein the two fault blocks are selected from the fault bank data structure.

19. The system of claim 16, wherein the operation to align the first fault block with the other fault block according to a permitted level of conflict between fault blocks comprises:

dividing each of the two fault blocks into at least three areas including a solid area, a sponge area, and an empty area; and calculating a conflict between the two fault blocks according to an overlap of the three areas of the two fault blocks in a current position of the fault blocks during alignment.

20. The system of claim 19, wherein a solid area of the first fault block overlapping a solid area of the other fault block has a higher calculated conflict than a sponge area of the first fault block overlapping a solid area of the other fault block.

* * * * *